United States Patent
Dougherty

(10) Patent No.: US 6,751,528 B1
(45) Date of Patent: Jun. 15, 2004

(54) RESIDENTIAL CIRCUIT ARC DETECTION

(75) Inventor: John James Dougherty, Collegeville, PA (US)

(73) Assignee: General Electric Company, Schenectady, NY (US)

( * ) Notice: Subject to any disclaimer, the term of this patent is extended or adjusted under 35 U.S.C. 154(b) by 640 days.

(21) Appl. No.: 09/722,187

(22) Filed: Nov. 27, 2000

(51) Int. Cl.[7] .............................. G05D 3/12; G05D 5/00; G05D 9/00; G05D 11/00; G05D 17/00; G06F 19/00; G01R 31/08; G01R 31/12; H02H 3/00; H02H 7/00; H02H 9/02

(52) U.S. Cl. .................. 700/293; 702/58; 324/536; 361/5; 361/93.1

(58) Field of Search .................. 700/292, 293; 702/58–60; 324/536; 361/5, 63, 62, 93.1, 93.2, 100

(56) References Cited

U.S. PATENT DOCUMENTS

| | | | |
|---|---|---|---|
| 4,466,071 A | 8/1984 | Russell, Jr. | 700/293 |
| 4,589,052 A | 5/1986 | Dougherty | 361/94 |
| 5,185,684 A | 2/1993 | Beihoff et al. | 361/45 |
| 5,185,685 A | 2/1993 | Tennies et al. | 361/45 |
| 5,185,686 A | 2/1993 | Hansen et al. | 361/45 |
| 5,185,687 A | 2/1993 | Beihoff et al. | 361/45 |
| 5,206,596 A | 4/1993 | Beihoff et al. | 324/536 |
| 5,208,542 A | 5/1993 | Tennies et al. | 324/544 |
| 5,223,795 A | 6/1993 | Blades | 324/536 |
| 5,280,404 A | 1/1994 | Ragsdale | 361/113 |
| 5,432,455 A | 7/1995 | Blades | 324/536 |
| 5,434,509 A | 7/1995 | Blades | 324/536 |
| 5,459,630 A | 10/1995 | MacKenzie et al. | 361/45 |
| 5,475,556 A * | 12/1995 | Yoon et al. | 361/87 |
| 5,485,093 A | 1/1996 | Russell et al. | 324/522 |
| 5,506,789 A | 4/1996 | Russell et al. | 702/58 |
| 5,512,832 A | 4/1996 | Russell et al. | 324/522 |
| 5,546,266 A * | 8/1996 | Mackenzie et al. | 361/93.4 |
| 5,550,751 A | 8/1996 | Russell | 700/293 |
| 5,578,931 A | 11/1996 | Russell et al. | 324/536 |
| 5,590,012 A | 12/1996 | Dollar, II | 361/113 |
| 5,600,526 A | 2/1997 | Russell et al. | 361/65 |
| 5,602,709 A * | 2/1997 | Al-Dabbagh | 361/85 |
| 5,659,453 A | 8/1997 | Russell et al. | 361/93.1 |
| 5,715,125 A | 2/1998 | Neiger et al. | 361/42 |
| 5,805,397 A | 9/1998 | MacKenzie | 361/42 |
| 5,805,398 A | 9/1998 | Rae | 361/42 |
| 5,815,352 A | 9/1998 | Mackenzie | 361/42 |
| 5,818,237 A | 10/1998 | Zuercher et al. | 324/536 |
| 5,835,321 A | 11/1998 | Elms et al. | 361/45 |
| 6,002,561 A * | 12/1999 | Dougherty | 361/93.4 |
| 6,128,169 A | 10/2000 | Neiger et al. | 361/42 |
| 6,628,487 B1 * | 9/2003 | Macbeth | 361/42 |

* cited by examiner

Primary Examiner—Leo Picard
Assistant Examiner—Ryan Jarrett
(74) Attorney, Agent, or Firm—Cantor Colburn LLP

(57) ABSTRACT

An electronically controlled circuit breaker for detecting arc and a method for detecting arc conditions are disclosed. The circuit breaker and method uses digital Fourier transformation on sampled line current signals and bins the even, odd, and fundamental transforms. Even arc signals and non-harmonic arc signals are calculated from the values in the bins and used within an expert arc algorithm which uses an accumulator to sum an increment based on whether the even arc signals and non harmonic arc signals exceed a fixed threshold. A trip signal is issued when the increment exceeds a predetermined value.

27 Claims, 2 Drawing Sheets

RESIDENTIAL CIRCUIT ARC DETECTION

BACKGROUND OF THE INVENTION

This invention relates generally to residential circuit arc detection, and, more particularly, this invention relates to arc detection employing frequency analysis which does not give false indications under the wide variety of "normal" loads.

U.S. Pat. Nos. 5,659,453 and 5,578,931 to Russell describe systems for low level arc detection in electrical distribution circuits. These systems do not eliminate the odd harmonics, in fact, they incorporate them into the arc detection. This works in utility distribution circuits which supply many homes, commercial and industrial establishments. In such circuits, the current sums many linear and non-linear loads. As linear (primarily fundamental) loads dominate the normal current, the appearance of odd harmonics can signal arcing in a distribution circuit. In a residence, however, some circuits have non-linear loads like light dimmers which provide significant odd harmonics and are always present. As such, odd harmonics do not distinguish arcs from loads. These systems also disclose an approach to collection of non-harmonic energy by way of integer+half (30, 90, 150, 210 Hz, etc.) to represent non-harmonic energy. Unfortunately, this approach ignores most of the non-harmonic frequency band.

The prior art also employs time domain procedures which attempt to use filters and heuristic methods (from examining arcs) to distinguish arcing from non-linear loads.

BRIEF SUMMARY OF THE INVENTION

The above discussed and other drawbacks and deficiencies are overcome or alleviated by an electronically-controlled circuit breaker comprising a line current sensor sensing line current signals, a conditioning circuit for splitting the line current signals into a first signals and a second signals, a high pass filter for passing amplified first signals, an analog to digital converter for converting the current signals into binary form, a processor for receiving the binary form of the current signals, wherein the processor determines the fundamental frequency of the current signals, processes the first multiples of the fundamental frequency, and squares and sums the multiples to yield even, odd, and fundamental values, even, odd, and fundamental bins within the processor for receiving the even, odd, and fundamental values, wherein the processor processes even arc signals and non-harmonic arc signals from the even, odd, and fundamental values in the bins, and an expert arc algorithm within the processor having an accumulator for calculating an incremental value based on even arc signal and non-harmonic arc signal input and a fixed threshold for which to compare the incremental value, wherein the processor issues a trip signal when the fixed threshold is exceeded by the incremental value.

Similarly, a method for detecting arc conditions in an electronically-controlled circuit breaker comprises detecting line current signals with a line current sensor, splitting the line current signals with a conditioning circuit into first line current signals and second line current signals, amplifying the first line current signals, passing the amplified first line current signals through a high pass filter, sending the first line current signals from the high pass filter and the second line current signals to an analog to digital converter, converting the line current signals into binary form in the analog to digital converter, determining the fundamental frequency of the first line current signals in a processor and processing the first sixteen harmonics of the fundamental frequency, providing even, odd, and fundamental bins within the processor for binning the fundamental frequency, even harmonic, and odd harmonic values, creating a mean square value from the second line current signals, processing even arc signals and non-harmonic arc signals from the values in the bins, calculating an incremental value based on the even arc signals and non-harmonic arc signals, comparing the incremental value to a fixed threshold, and issuing a trip signal indicating an arc fault condition when the fixed threshold is exceeded by the incremental value.

The above-discussed and other features and advantages of the present invention will be appreciated and understood by those skilled in the art from the following detailed description and drawings.

BRIEF DESCRIPTION OF THE DRAWINGS

Referring to the FIGURES wherein like elements are numbered alike in the several FIGURES.

DETAILED DESCRIPTION OF THE INVENTION

Figure 1:
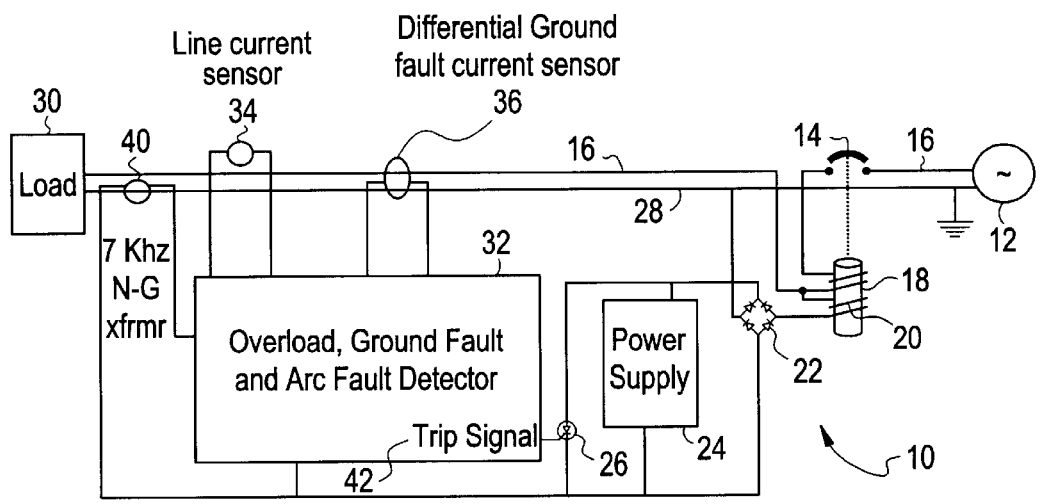
FIG. 1 shows a circuit diagram of an electronically-controlled circuit breaker.

FIG. 1 shows an example of an electronically-controlled circuit breaker with time overcurrent arcing and instantaneous protection and ground fault protection. In this application, the circuit breaker 10 connects to a 120 Volt source 12. After the circuit breaker contacts 14, the line circuit 16 is wound around the AC solenoid 18 for several turns. This provides a current-based instantaneous trip for bolted faults at the circuit breaker 10 which do not allow the electronic circuits to power on. At this point, the line 16 is tapped and connected to the solenoid coil 20.

The solenoid 18 connects to a bridge rectifier 22. A bridge rectifier uses diodes to generally convert ac voltages into dc voltages. The basic principle of a diode is that current can flow through in one direction, from cathode to anode, but not in the other. Practically speaking, diodes have some resistance when forward biased, but the value is very low. Similarly, some current flows through a diode when it is reverse-biased, but the resistance is so high the current will be of a negligible value. A bridge rectifier uses the entire input cycle, and is easy to filter. A bridge rectifier requires four diodes as shown. At any point of the input cycle, two of the diodes in a bridge are conducting and two are reverse biased.

The positive output of the bridge rectifier 22 connects to the low voltage power supply 24 and a silicon controlled rectifier "SCR" 26 which is used to operate the solenoid 18. An SCR is a special purpose semiconductor device which uses a similar symbol as a diode with the addition of a third lead, called a gate. If a voltage is applied between the cathode and the anode, but the gate is at zero volts (grounded), no current will flow through an SCR. If a voltage greater than some specific value is applied to the gate, current will start to flow from cathode to anode against only a small internal resistance (as with an ordinary diode). This current will continue to flow—even if the voltage on the gate is removed. The only way to stop the current flow through an SCR once it has started is to decrease the positive voltage on the anode (or remove it altogether). When the anode voltage drops below a predetermined level, current flow will be blocked, even if the anode voltage returns to its original value, unless the gate receives the required triggering voltage.

The other AC input to the bridge rectifier 22 is connected to neutral 28 to complete the circuit. The load 30 is where the electrical energy is usefully employed, that is, where the energy is converted from electrical form into some other form.

An important feature of the present invention occurs in the center block 32 where the protection functions (Overload, Ground Fault and Arc Fault Detector) are represented. This block receives power from the power supply 24, and signals from 2 current sensors 34, 36 where sensor 34 senses line current and sensor 36 senses the differential current between line 16 and neutral 28. The block 32 includes a dormant oscillator 38 (where an oscillator is an electronic circuit that produces a repeating ac signal), which uses the 7 KHz neutral coil 40 to inject a ground current on the neutral line 28 when the neutral 28 and ground lines are shorted. Ground wires (not shown) are attached to the neutral wires in the load center 30 between the circuit breaker 10 and the utility source 12. By code, the ground wire, which runs in the same sheath as the neutral and protected line wires, should never be connected to the neutral wire downstream of the circuit breaker 10 (between the circuit breaker 10 and the load 30). The dormant oscillator circuit 38 senses when this condition (which can defeat ground fault protection) occurs. The block 32 also provides a trip signal 42 to the SCR 26 to energize the solenoid coil 20 and operate the circuit breaker 10 when an arcing, time overcurrent, instantaneous or ground fault condition occurs.

Figure 2:
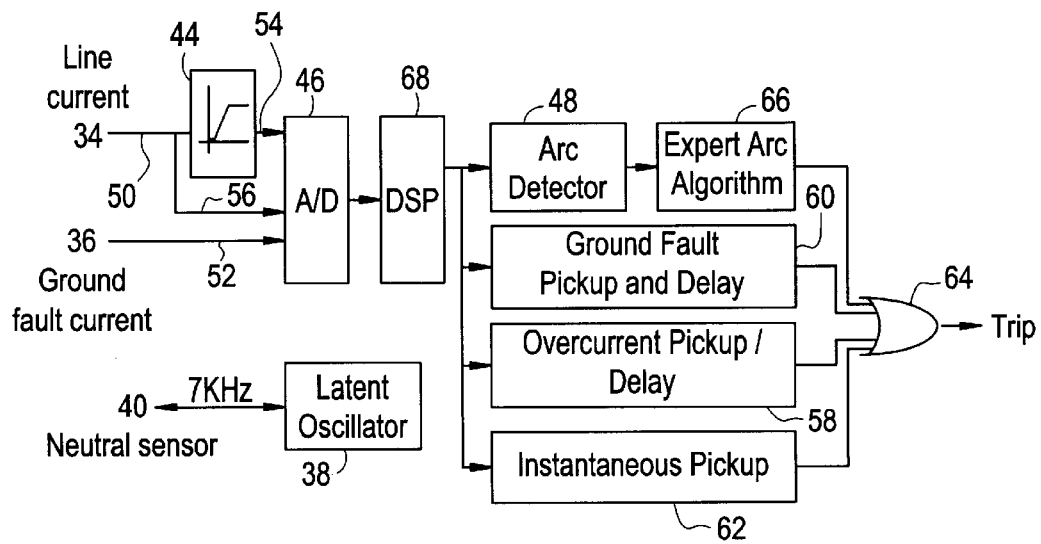
FIG. 2 shows a block diagram of the major elements occurring in the overload, ground fault, and arc fault detector block of FIG. 1.

FIG. 2 shows the major elements of the center block 32 in FIG. 1. Simple conditioning circuits split the line current signal 50 from the line current sensor 34 into two signals 54, 56 where signals 54 are amplified and passed through a high pass filter 44. A high pass filter allows high frequencies (frequencies greater than the fundamental) to pass through to the output, but increasingly blocks lower frequencies. These signals 54, 56 from the line current sensor 34 and the ground fault signal 52 from the ground fault current sensor 36 are sampled in an analog to digital converter 46 at multiple, preferably at least 32 times, the fundamental frequency. An analog to digital converter accepts a voltage and gives an output number in binary form proportional to the voltage. The primary frequency is called the fundamental frequency, or just fundamental, and the multiples of the fundamental are called harmonics. The line current signals 54, 56 are passed to an arc detector block 48 which provides detection and tripping of the circuit breaker 10 due to arc faults.

As part of the arc detection, the mean square or "MS" of the line current is generated and passed to the time overcurrent section 58 for conventional electronic overcurrent protection. Methods for using sampled data as overcurrent protection exist in the art including U.S. Pat. No. 4,589,052, hereby incorporated by reference. Similarly, the sampled ground fault signals 52 provide input to a conventional electronic ground fault protection represented at block 60. The raw line current samples 56 are processed by a peak detecting algorithm to provide instantaneous tripping represented at block 62. Trip conditions from any of these four elements are combined in a logical 'OR' circuit 64 (gate) to operate the trip solenoid 18 by pulsing the SCR device 26. The SCR 26 conducts current from the line 16 through the trip solenoid coil 20 and bridge rectifier 22 and finally to the neutral circuit 28. These elements provide the full breaker function and are required as part of a usable circuit breaker 10.

Figure 3:
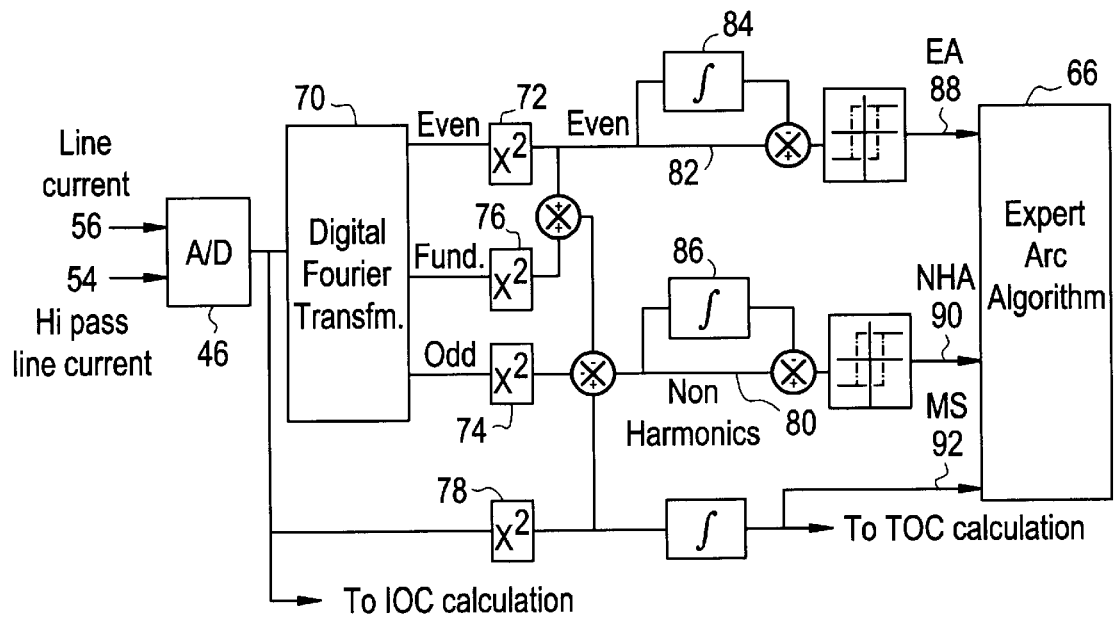
FIG. 3 shows a block diagram of the digital signal processing that occurs in FIG. 2; and, FIG. 4 shows a block diagram of an arc algorithm that is used following the digital signal processing shown in FIG. 3.

The line current values 54, 56, after passing through the analog to digital converter 46, are employed in an "Instantaneous OverCurrent" calculation ("IOC" as shown in FIG. 3). Such a calculation is part of a basic circuit breaker function.

A main feature of the present invention is the arc detection 48 and expert arc tripping algorithm 66. FIG. 3 shows a block diagram of arc detection 48, in particular, the digital signal processing (from the digital signal processor 68 or DSP) that occurs in FIG. 2. As discussed with respect to FIG. 2, the input signals 50 of line current from the line current sensor 34 are sampled. Sampling is where signals are not measured or specified continuously, but rather at fixed intervals of time. Thus, where the signals are measured only at the discrete times, then the discrete Fourier Transform represented by block 70 is processed. The high pass samples 54 (frequencies>fundamental) are processed in a microcomputer 68 to yield the discrete Fourier components of the first 16 harmonics of the fundamental (that is, the first 16 multiples of the fundamental frequency). Although the first 16 harmonics are preferred, it would be within the scope of this invention to employ a differing number of harmonics. These amplitude values are squared and summed into three 'bins' for each cycle, the even bin 72 ($2^{nd}$, $4^{th}$, 6, 8, 10, 12, 14, and $16^{th}$), the odd bin 74 ($3^{rd}$, $5^{th}$, 7, 9, 11, 13, 15), and the fundamental bin 76($1^{st}$).

Separately, the unfiltered line current samples 56 are squared and summed to create a mean square (MS) value 78 of the total current. The fundamental signal 76 is also drawn from this unfiltered signal 56 via discrete Fourier transformation 70. The non-harmonic signal 80 is achieved by subtracting the sum of squares of the odd 74, even 72, and fundamental 76 harmonics from the sum of squares 78 of the line current 56.

Note that no anti-aliasing filter has been applied. By definition, such filters modify the frequency structure of the sensed signal, which is not a desirable or necessary feature for this invention. A unique idea in this concept, which involves binning of even, odd, and non-harmonic energy, is that the higher order frequencies will alias into the proper bins. Arc energy can be of a higher frequency, but conducted currents, both fundamental and harmonic, tend to drop off dramatically above the $13^{th}$ harmonic. Eliminating the anti-aliasing filter and selecting an exact multiple of the fundamental frequency allows energy from these higher order frequencies to be collected in the proper frequency bins: odd, even, and non.

The interim result of these calculations is two values, both single cycle mean square, of the even harmonics 82 and the non-harmonics 80 (energy in the waveform not occurring at harmonics of the fundamental). A major premise of this invention is that the even 82 and non-harmonics 80 are uniquely indicative of arcing conditions.

These signals may occur in small quantities naturally (dither in a dimmer circuit will generate even harmonics). Both signals are passed through multiple cycle integrators 84, 86 to average the background noise. This noise level is subtracted from the present signal. This results in the EA 88 (even arc) and NHA 90 (non-harmonic arc) signals. Both of these signals 88, 90 enter the expert arc tripping algorithm 66 as well as the current mean square current (MS) 92 used as a qualifier there.

The results of the integrated means square (MS) value 78 are fed to a Time Over Current calculation ("TOC") which is also part of a basic circuit breaker function.

Figure 4:
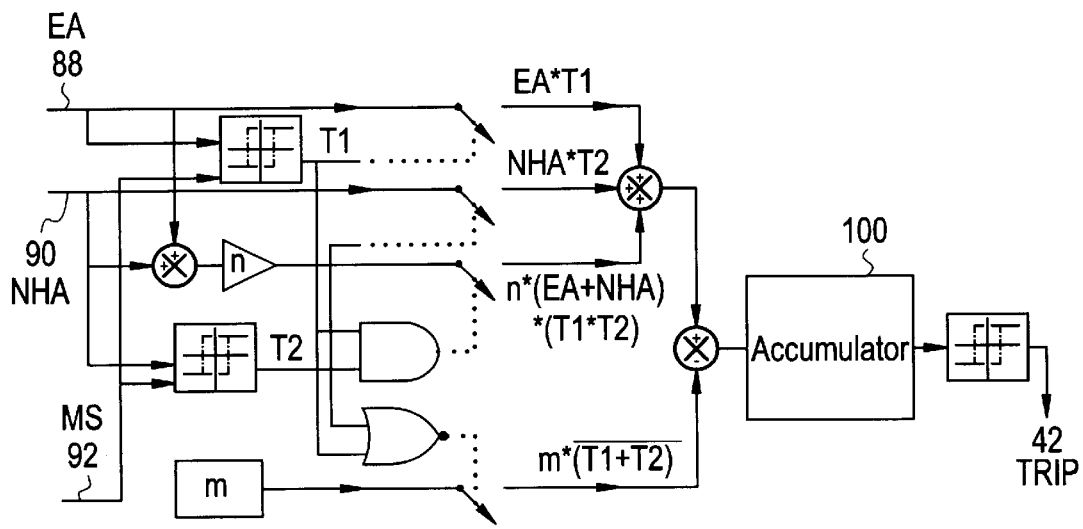

FIG. 4 shows generally what occurs in the expert arc tripping block 66. The amplitude of the EA 88 and NHA 90 signals are compared against a threshold which is a function of the mean square line current. This provides a final security level to avoid nuisance tripping. The expert arc accumulator 100 adds a value which follows:

$$\text{Increment} = EA*T1 + NHA*T2 + n*(EA+NHA)*(T1*T2) - m*(\text{not}T1*\text{not }T2)$$

where T1 and T2 are binary signals (values 1 or 0) which result from the comparison of the EA signal (T1) and NHA signal (T2) with a submultiple of the MS or mean square signal. As the basic load current (MS) increases, some amount of even (EA) and non (NHA) harmonic signal occurs naturally. The comparator elements that produce T1 and T2 will not produce a "1" unless the corresponding signal is greater than some proportion of the load current. Thus, in the equation, the signals EA and NHA are multiplied either by "1" or "0". This has the effect of not letting the EA or NHA signal pass to the final accumulator 100.

The above-described equation adds counts from either the even or non-harmonic input if the corresponding threshold has been exceeded. Threshold T1 is a binary signal which represents that the even harmonic signal EA is greater than a proportion of the load current MS. Threshold T2 is a binary signal which represents that the non-harmonic signal NHA is greater than a proportion of the load current MS. If both thresholds are exceeded, an acceleration factor n is applied to increase the trip count faster. If neither threshold is exceeded, the count is decreased by a linear factor m.

When the accumulator 100 exceeds a fixed threshold, the trip signal 42 is given.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An electronically controlled circuit breaker comprising:
   a line current sensor sensing line current signals;
   a processor for determining the fundamental frequency of the current signals, wherein the processor processes a preselected number of multiples of the fundamental frequency, and squares and sums the multiples to yield even, odd, and fundamental values;
   even, odd, and fundamental bins within the processor for receiving the even, odd, and fundamental values, wherein the processor processes even arc signals and non-harmonic arc signals from the even, odd, and fundamental values in the bins; and,
   an expert arc algorithm within the processor having an accumulator for calculating an incremental value based on even arc signal and non-harmonic arc signal input, and additionally wherein the processor applies an acceleration factor to the incremental value when both an even arc threshold and a non-harmonic arc threshold are exceeded by the even arc signal and the non-harmonic arc signal, respectively, and a fixed threshold for which to compare the incremental value;
   wherein the processor issues a trip signal when the fixed threshold is exceeded by the incremental value.

2. The electronically controlled circuit breaker of claim 1 further comprising a pair of separable contacts and a solenoid.

3. The electronically controlled circuit breaker of claim 2 further comprising a bridge rectifier connected to the solenoid.

4. The electronically controlled circuit breaker of claim 3 further comprising a silicon controlled rectifier connected to the bridge rectifier, wherein the, silicon controlled rectifier receives the trip signal from the processor and energizes the solenoid to separate the separable contacts when a tripping condition occurs.

5. The electronically controlled circuit breaker of claim 1 further comprising a neutral sensor.

6. The electronically controlled circuit breaker of claim 5 further comprising a dormant oscillator for receiving signals from the neutral sensor.

7. The electronically controlled circuit breaker of claim 1 further comprising a ground fault sensor for sensing differential current signals between line and neutral.

8. The electronically controlled circuit breaker of claim 7 further comprising means for detecting ground fault conditions, means for detecting overcurrent conditions, and means for detecting line current peaks for instantaneous protection.

9. The electronically controlled circuit breaker of claim 8 further comprising a logical OR circuit for receiving trip condition notification from any of the means for detecting ground fault conditions, means for detecting overcurrent conditions, means for detecting line current peaks, and the expert arc algorithm, wherein, upon receipt of a trip condition notification, the logical OR circuit sends the trip signal.

10. The electronically controlled circuit breaker of claim 1 further comprising a conditioning circuit for splitting the line current signals into first signals and second signals.

11. The electronically controlled circuit breaker of claim 10 further comprising a high pass filter for passing amplified first signals.

12. The electronically controlled circuit breaker of claim 11 further comprising an analog to digital converter for converting the current signals into binary form.

13. The electronically controlled circuit breaker of claim 1 wherein the processor decreases the incremental value if neither the even arc threshold nor the non-harmonic arc threshold is exceeded.

14. The electronically controlled circuit breaker of claim 13 wherein the processor decreases the incremental value by a linear factor when neither the even arc threshold nor the non-harmonic threshold is exceeded.

15. The electronically controlled circuit breaker of claim 1 wherein the processor multiplies the acceleration factor to a sum of the even arc signal and the non-harmonic arc signal when both the even arc threshold and the non-harmonic arc threshold are exceeded.

16. An electronically controlled circuit breaker comprising:
   a line current sensor sensing line current signals;
   a processor for determining the fundamental frequency of the current signals, wherein the processor processes a preselected number of multiples of the fundamental frequency, and squares and sums the multiples to yield even, odd, and fundamental values;

even, odd, and fundamental bins within the processor for receiving the even, odd, and fundamental values, wherein the processor processes even arc signals and non-harmonic arc signals from the even, odd, and fundamental values in the bins; and, an expert arc algorithm within the processor having an accumulator for calculating an incremental value based on even arc signal and non-harmonic arc signal input and a fixed threshold for which to compare the incremental value;

wherein the incremental value is calculated using the equation:

$$\text{Increment} = (EA*T1) + (NHA*T2) + (n*(EA+NHA)*(T1*T2)) - (m*(\text{not } T1* \text{ not } T2))$$

where thresholds T1 and T2 are binary signals which represent that the EA even harmonic signal or NHA non harmonic signal, respectively, is greater than a predetermined proportion of load current of the circuit breaker and where n is an acceleration factor applied when both thresholds T1 and T2 are exceeded and m is a linear factor used to decrease the Increment when neither threshold T1 nor T2 is exceeded; and wherein the processor issues a trip signal when the fixed threshold is exceeded by the incremental value.

17. A method for detecting arc conditions in an electronically-controlled circuit breaker, the method comprising:

providing an even arc threshold and a non-harmonic arc threshold;

calculating an incremental value based on even arc signals and non-harmonic arc signals, wherein calculating the incremental value comprises comparing the even arc signals with the even arc threshold and the non-harmonic arc signals with the non-harmonic arc threshold, applying an acceleration factor to the incremental value if both the even arc threshold and the non-harmonic arc threshold are exceeded, and decreasing the incremental value if neither the even arc threshold nor the non-harmonic arc threshold is exceeded;

comparing the incremental value to a fixed threshold; and, issuing a trip signal indicating an arc fault condition when the fixed threshold is exceeded by the incremental value.

18. The method of claim 17 further comprising, prior to calculating an incremental value:

detecting line current signals with a line current sensor;

determining the fundamental frequency of the line current signals in a processor and processing a preselected number of harmonics of the fundamental frequency;

providing even, odd, and fundamental bins within the processor for binning the fundamental frequency, even harmonic, and odd harmonic values; and, processing even arc signals and non-harmonic arc signals from the values in the bins.

19. The method of claim 18 further comprising, subsequently detecting line current signals, splitting the line current signals with a conditioning circuit into first line current signals and second line current signals, amplifying the first line current signals, and passing the amplified first line current signals through a high pass filter.

20. The method of claim 19 further comprising creating a mean square value from the second line current signals.

21. The method of claim 20 wherein creating a mean square value from the second line current signals comprises squaring each second line current signal and summing each squared second line current signal with additional squared second line current signals for each cycle of line current signals.

22. The method of claim 20 further comprising comparing amplitudes of the even arc signals and the non-harmonic arc signals against a threshold which is a function of the mean square value.

23. The method of claim 17 further comprising detecting ground fault conditions, overcurrent conditions, and line current peaks, notifying a logical OR circuit of a trip condition, and issuing a trip signal upon notification of a trip condition from either ground fault conditions, overcurrent conditions, line current peaks, or arc fault conditions.

24. The method of claim 23 further comprising pulsing a silicon controlled rectifier upon receipt of the trip signal.

25. The method of claim 18 further comprising, subsequently providing even, odd, and fundamental bins, squaring each value in the bins and adding the squared value in the bins with additional squared values for each cycle of line current signals.

26. The method of claim 18 wherein processing even arc signals and non-harmonic arc signals from the values in the bins comprises passing even harmonic signals and non harmonic signals through multiple cycle integrators to average background noise.

27. The method of claim 17 wherein calculating the incremental value comprises employing the equation:

$$\text{Increment} = (EA*T1) + (NHA*T2) + (n*(EA+NHA)*(T1*T2)) - (m*(\text{not } T1* \text{ not } T2))$$

where thresholds T1 and T2 are binary signals which represent that the EA even harmonic signal or NHA non harmonic signal, respectively, is greater than a predetermined proportion of load current of the circuit breaker and where n is an acceleration factor applied when both thresholds T1 and T2 are exceeded and m is a linear factor used to decrease the Increment when neither threshold T1 nor T2 is exceeded.

* * * * *

UNITED STATES PATENT AND TRADEMARK OFFICE
CERTIFICATE OF CORRECTION

PATENT NO. : 6,751,528 B1 Page 1 of 1
APPLICATION NO. : 09/722187
DATED : June 15, 2004
INVENTOR(S) : Dougherty It is certified that error appears in the above-identified patent and that said Letters Patent is hereby corrected as shown below:

Column 2,
Line 35, after "breaker", insert therefor --10--.

Signed and Sealed this

Eleventh Day of July, 2006

JON W. DUDAS
*Director of the United States Patent and Trademark Office*